(12) United States Patent
Din et al.

(10) Patent No.: US 9,077,290 B2
(45) Date of Patent: Jul. 7, 2015

(54) LOW-NOISE AMPLIFIER WITH IMPEDANCE BOOSTING CIRCUIT

(75) Inventors: Imad ud Din, Lund (SE); Henrik Sjöland, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 100 days.

(21) Appl. No.: 13/988,595

(22) PCT Filed: Sep. 23, 2011

(86) PCT No.: PCT/EP2011/066577
§ 371 (c)(1),
(2), (4) Date: Aug. 6, 2013

(87) PCT Pub. No.: WO2012/069231
PCT Pub. Date: May 31, 2012

(65) Prior Publication Data
US 2013/0314164 A1    Nov. 28, 2013

Related U.S. Application Data

(60) Provisional application No. 61/423,826, filed on Dec. 16, 2010.

(30) Foreign Application Priority Data

Nov. 22, 2010    (EP) .................................... 10014844

(51) Int. Cl.
*H03F 3/193*    (2006.01)
*H03F 1/02*    (2006.01)
(Continued)

(52) U.S. Cl.
CPC .......... *H03F 3/193* (2013.01); *H03F 2200/181* (2013.01); *H03F 2200/492* (2013.01); *H03F 1/0205* (2013.01); *H03F 1/223* (2013.01); *H03F 1/565* (2013.01); *H03F 3/45179* (2013.01);
(Continued)

(58) Field of Classification Search
CPC ........... H03F 1/22; H03F 1/223; H03F 1/226; H03F 2200/181; H03F 2200/492
USPC .................................................. 330/283, 311
See application file for complete search history.

(56) References Cited

U.S. PATENT DOCUMENTS 7,256,646 B2 * 8/2007 Eid et al. ........................ 327/563
8,203,388 B2 * 6/2012 Kathiresan et al. ........... 330/311
(Continued)

FOREIGN PATENT DOCUMENTS

| CN | 101375504 A | 2/2009 |
|---|---|---|
| GB | 2374477 A | 10/2002 |
| WO | 0141302 A1 | 6/2001 |
| WO | 2007006867 A1 | 1/2007 |
| WO | 2007085866 A1 | 8/2007 |
| WO | 2008146256 A2 | 12/2008 |

*Primary Examiner* — Steven J Mottola
(74) *Attorney, Agent, or Firm* — Murphy, Bilak & Homiller, PLLC

(57) ABSTRACT

A low-noise amplifier (300) is provided which comprises an input circuit (301) configured to operate with a variable bias current and an impedance boosting circuit (314) electrically connected to the input circuit (301). The impedance boosting circuit (314) comprises at least one switch (316) and at least one tail inductor (318) electrically connected with the at least one switch (316). The low-noise amplifier (300) is configured to activate the impedance boosting circuit (314) if the variable bias current is reduced, and the impedance boosting circuit (314) is configured to increase the input impedance of the low-noise amplifier (300) if the impedance boosting circuit (314) is activated.

24 Claims, 13 Drawing Sheets

(51) Int. Cl.
*H03F 1/22* (2006.01)
*H03F 1/56* (2006.01)
*H03F 3/45* (2006.01)

(52) U.S. Cl.
CPC ...... *H03F 3/45197* (2013.01); *H03F 2200/294* (2013.01); *H03F 2200/451* (2013.01); *H03F 2200/489* (2013.01); *H03F 2203/45316* (2013.01)

(56) References Cited

U.S. PATENT DOCUMENTS

2006/0284670 A1  12/2006  Eid et al.
2008/0029753 A1   2/2008  Xu et al.
2009/0009250 A1   1/2009  Satoh et al.

* cited by examiner

LOW-NOISE AMPLIFIER WITH IMPEDANCE BOOSTING CIRCUIT

TECHNICAL FIELD

The present disclosure generally relates to the field of low-noise amplifiers. In particular, the disclosure relates to a low-noise amplifier configured to reduce the biasing current without degrading the impedance match with, for example, a Radio Frequency (RF) filter and other RF front end components.

BACKGROUND

Low-Noise Amplifiers (LNAs) are critical components of radio receivers. The primary purpose of an LNA is to provide sufficient gain to input signals such that the signal level is adequate for signal processing blocks downstream of the LNA. That is, the downstream signal processing blocks require a minimum signal level in order to effectively operate on inputs signals without drastically increasing the overall noise figure. In addition to providing sufficient gain, the LNA should process an input signal linearly and with a low noise figure. Further, the input impedance of an LNA should adequately match an upstream RF filter present in an RF front end of the radio receiver.

In addition to the above design criteria, an LNA must also meet the toughest criteria imposed by standards such as the Long-Term Evolution (LTE) Release 8 and Release 10 specifications.

A prior art solution to meet all of the above criteria is shown in FIG. 1, which is a schematic block diagram illustrating a conventional inductively degenerated common-source LNA. Typically, the input impedance of an LNA is designed to be a real value (e.g., 50 Ohms) that matches the output impedance of an RF front end. For this purpose an inductance $L_g$ is introduced to cancel out the capacitive part (i.e., the imaginary part) of the input impedance at a desired operating frequency. The input impedance $Z_{in}$ of the LNA can be calculated by the following formula:

$$z_{in} = \frac{g_m \cdot L_s}{C_{gs}} + j\left[\omega(L_s + L_g) - \frac{1}{\omega C_{gs}}\right]$$

The real part of the input impedance is dependant upon the forward trans-conductance $g_m$ of transistor $M_1$, capacitance $C_{gs}$ and inductance $L_s$. Capacitor C is a DC blocking capacitor and resistor R is placed between $V_{bias}$ and transistor $M_r$.

WO 07/006867 discloses a switchable symmetric shortcut at the certain location of a monolithic planar inductor whose inductance is practically distributed into smaller inductor portions. The smaller inductor portions are provided in a cascade configuration in a manner that causes inductor to function as a differential inductor device. In the configuration, an intermediate node between the (electrically) intermediate inductor portions forms common-mode point and the outer ends of the (electrically) outer inductor portions form differential-mode outputs of the differential inductor. Some of the inductor portions are arranged to be symmetrically bypassed or shortcut in relation to the common point in one or more steps for operation in one or more higher radio frequency bands. By means of the switchable symmetric shortcut, a controllable inductance step can be provided.

WO 07/085866 discloses an amplifier having multiple gain modes comprises a plurality of cascoded input transistors connected to an input and arranged in parallel, a degeneration stage connected to the input transistors and having a variable impedance, and switching means for switching between different modes of the amplifier by switching off one or more of the input transistors and varying the impedance of the degeneration stage.

Further related art can be found in WO 01/41302 and US Patent Publication No. 2008/0029753.

Reducing the bias current $I_D$ of transistor $M_1$ affects the forward trans-conductance $g_m$. When the transistor $M_1$ operates in the saturation region, the following formula applies:

$$g_m \propto \sqrt{I_D}$$

As the bias current is reduced, the transistor $M_1$ leaves the saturation and active regions and enters the sub-threshold region, where:

$$g_m \propto I_D$$

Thus the dependence of $g_m$ (and hence of the input impedance $Z_{in}$) on $I_D$ strengthens as $I_D$ is reduced. This means that the real part of the input impedance $Z_{in}$ drops increasingly faster in relation to a linear reduction of $I_D$.

This behaviour is a drawback because power consumption of an LNA accounts for a significant percentage of the total power budget for a radio receiver, and one conventional technique for reducing power consumption is to reduce the bias current of transistor $M_1$.

SUMMARY

Accordingly, there is a need for a circuit topology configured to reduce the bias current of an LNA without degrading the impedance match with an RF front end.

Thus a low-noise amplifier according to one aspect includes an input circuit configured to operate with a variable bias current. The input circuit comprises a transistor having a gate electrically connected to a gate inductor and a source electrically connected to a source inductor, wherein the gate inductor is electrically connected to the input terminal. The low-noise amplifier further includes an impedance boosting circuit electrically connected to the source inductor. The impedance boosting circuit comprises at least one switch and at least one tail inductor electrically connected to the at least one switch. The at least one trail inductor increases the input impedance of the low-noise amplifier when the impedance boosting circuit is activated via the at least one switch. The low-noise amplifier is configured to activate the impedance boosting circuit if the variable bias current is reduced.

In the low-noise amplifier, the at least one tail inductor may be connected in parallel with at least one switch. The switch may be implemented as comprising a transistor and may be controlled by a control signal that activates and de-activates the impedance boosting circuit and thereby varies the input impedance of the low-noise amplifier.

The impedance boosting circuit may comprise at least two tail inductors and at least two switches. The switches may comprise switch transistors. The switch transistors may be controlled by a control signal that may activate and de-activate the impedance boosting circuit. In one implementation, the control signal varies the total inductance of the impedance boosting circuit and thereby varies the input impedance of the low-noise amplifier.

In one implementation, the low-noise amplifier is configured as a single-ended amplifier. The drain of the transistor may be electrically connected to the output terminal of the low-noise amplifier if the low-noise amplifier is a single-stage amplifier or to a second stage if the low-noise amplifier is a multistage amplifier. Moreover, the gate inductor may be electrically connected to the input terminal and the impedance boosting circuit may be electrically connected to the source inductor.

In another implementation, the low-noise amplifier is configured as a differential amplifier that may include two input circuits and two impedance boosting circuits. The two input circuits may each include a transistor, a gate inductor, and a source inductor. The source inductors of the two input circuits may be electrically connected to one of the two impedance boosting circuits, respectively.

The low-noise amplifier may also be configured as a differential amplifier that includes two input circuits and an impedance boosting circuit. The two input circuits may each include a transistor, a gate inductor, and a source inductor, and the impedance boosting circuit may be electrically connected to each of the source inductors of the two input circuits. The impedance boosting circuit may include at least two tail inductors electrically connected to at least one switch transistor.

In a further implementation, the low-noise amplifier is configured as a differential amplifier comprising two input circuits include at least two tail inductors electrically connected in series. The impedance boosting circuit may further include at least two switch transistors electrically connected to both the two branches of tail inductors and configured to be controlled by a control signal that thereby varies the input impedance of the low-noise amplifier.

Each branch of the tail inductors may further comprise a third tail inductor electrically connected to a third switch transistor. Further, the third tail inductors may be configured as one combined or single differential inductor with a center tap connected to signal ground.

The low-noise amplifier may be configured to deactivate the impedance boosting circuit if the variable bias current is increased, and optionally, to reduce the variable bias current if an input signal amplitude is above a predetermined value. Depending on the component parameters of an LNA and the desired performance criteria (i.e., maximum acceptable noise figure, average power consumption, etc.), a wide range of predetermined values may be selected.

The inductance of the tail inductor may be selected such that the input impedance of the low-noise amplifier matches the output impedance of a circuit electrically connected to an input terminal of the low-noise amplifier when the impedance boosting circuit is activated.

The low-noise amplifier may be configured to selectively operate in at least a high-performance mode and low-performance mode, wherein a bias current for the high-performance mode is higher than a bias current for the low-performance mode. The low-noise amplifier may also be configured to activate the impedance boosting circuit if operating in the low-performance mode, and to deactivate the impedance boosting circuit if operating in the high-performance mode. Depending on the component parameters of an LNA and the desired performance criteria, a wide range of bias current levels may be selected for the high-performance mode and the low-performance mode.

In one implementation, the low-noise amplifier further includes a control unit configured to provide an analog or digital control signal. As an example, the control signal may be a one-bit or a multi-bit control signal.

Another aspect relates to a circuit arrangement with a low-noise amplifier as described herein and an RF front end stage providing an input signal to the input terminal of the low-noise amplifier. The tail inductor increases the input impedance of the low-noise amplifier when the impedance boosting circuit is active such that the input impedance of the low-noise amplifier matches the output impedance of the RF front end stage.

The RF front end stage advantageously comprises a radio frequency filter, wherein the tail inductor increases the input impedance of the low-noise amplifier when the impedance boosting circuit is activated such that the input impedance of the low-noise amplifier matches the output impedance of the radio frequency filter.

According to a method aspect, a method of impedance matching a low-noise amplifier with another electrical circuit includes the method of claim 18.

The method may further include selectively operating the low-noise amplifier in at least a high-performance mode or a low-performance mode, wherein a bias current for the high-performance mode is higher than a bias current for the low-performance mode. The impedance boosting circuit may be activated if operating in the low-performance mode and deactivating the impedance boosting circuit if operating in the high-performance mode.

Still further, the method may include determining the signal strength of the electrical signal and based on the determined signal strength, selecting the high-performance mode or the low-performance mode as an operating mode of the low-noise amplifier. Moreover, the method may include determining if the selected operating mode is the current operating mode. If the selected operating mode is different from the current operating mode, the method changes the operating mode to the selected operating mode.

BRIEF DESCRIPTION OF THE DRAWINGS

In the following, the LNA presented herein will be described with reference to exemplary embodiments illustrated in the drawings, wherein.

DETAILED DESCRIPTION

In the following, for purposes of explanation and not limitation, specific details are set forth, such as particular sequences of steps, components and configurations, in order to provide a thorough understanding of the present invention. It will be apparent to one skilled in the art that the present invention may be practiced in other embodiments that depart from these specific details. For example, although all the embodiments include fixed tail inductors, tail inductors may also be implemented as variable inductors.

Figure 1:
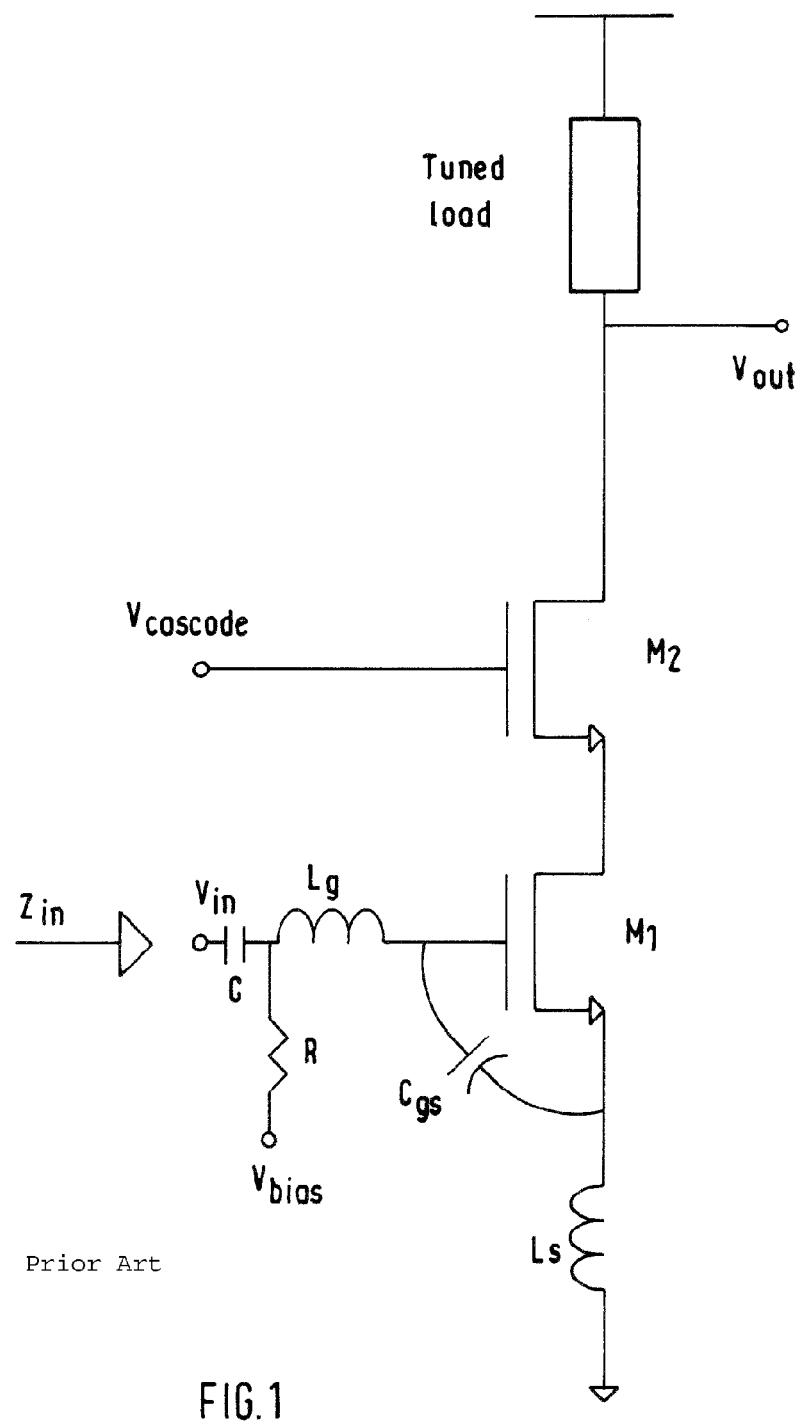
FIG. 1 is a schematic diagram illustrating a conventional inductively degenerated common-source LNA.
Figure 2:
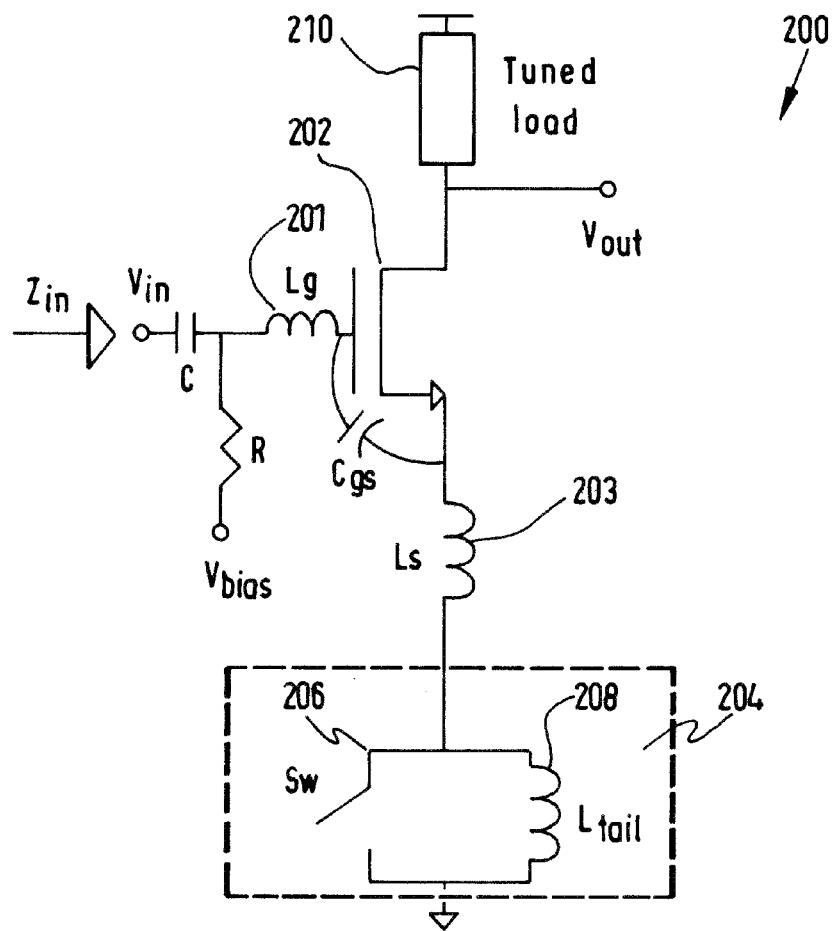
FIG. 2 is a schematic diagram illustrating a first embodiment of an LNA.

FIG. 2 is a schematic diagram illustrating a common-source embodiment of an LNA 200 comprising an input circuit 202, which includes a gate inductor 201 and a source inductor 203, and an impedance boosting circuit 204. The LNA 200 may be implemented in a mobile terminal (e.g., in a mobile telephone, a wireless network card or a data stick) of a communications network.

The input circuit 202 of the LNA is implemented as comprising the transistor, the gate inductor 201, and the source inductor 203 and is biased by $V_{bias}$. Moreover, a gate-source parasitic capacitor $C_{gs}$ of the transistor 302 is electrically connected to both the gate inductor 201 and the source inductor 203.

The input circuit 202 is electrically connected to the source inductor 203 and a tuned load 210. The impedance boosting circuit 204 comprises a switch 206 connected to signal ground and a tail inductor arranged in parallel to the switch 206. Capacitor C is a DC blocking capacitor and resistor R is placed between $V_{bias}$ and the gate inductor 201. In some embodiments, LNA 200 may be directly coupled without a DC blocking capacitor.

The LNA 200 receives an input signal $V_{in}$ from, for example, an RF front end of a mobile radio receiver and is amplified by the input circuit 202. The amplified signal is then outputted as output signal $V_{out}$. As will be explained in more detail with reference to FIG. 3 below, input impedance $Z_{in}$ is a function of parameters of the input circuit 202 and the impedance boosting circuit 204. That is, the impedance boosting circuit 204 is configured to increase the input impedance when the reduction in bias current causes an impedance match to degrade.

To explain further, when the LNA 200 operates with a large $V_{bias}$, the LNA 200 is able to amplify a signal without adding much noise and has a good impedance match between $Z_{in}$ and an output of a circuit that provides $V_{in}$. In this case, the switch 206 of the impedance boosting circuit 204 is switched on, rendering the impedance boosting circuit 204 inactive. In alternative embodiments, the impedance boosting circuit 204 may be active with the switch on.

When the LNA 200 is operating on a large input signal amplitude $V_{in}$, however, the best noise performance is not required to maintain a sufficient noise figure. In such cases, the LNA 200 could be switched to an alternate operating point that consumes less bias current in return for a slightly higher noise figure. The input impedance $Z_{in}$ should still match the output impedance of, for example, an RF filter providing $V_{in}$.

The impedance boosting circuit 204 can be activated if the variable bias current is reduced by turning the switch 206 off. Thus, the tail inductor 208 increases $Z_{in}$ of the LNA 200. Activating the impedance boosting circuit 204 if the variable bias current is reduced may include activating the circuit 204 before, during, and after reducing the variable bias current.

One skilled in the art will immediately recognize that the LNA 200 can be configured in any one of numerous ways to activate impedance boosting circuit 204. For example, the LNA 200 could be configured to switch based on a measured value of input impedance $Z_{in}$, input signal strength, and/or $V_{bias}$ strength, or a combination thereof. Alternatively, or in addition, the LNA 200 may be configured to operate in at least one of a low-performance mode and a high-performance mode, wherein the impedance boosting circuit 204 is activated based on which mode the LNA 200 is operating in.

Figure 3:
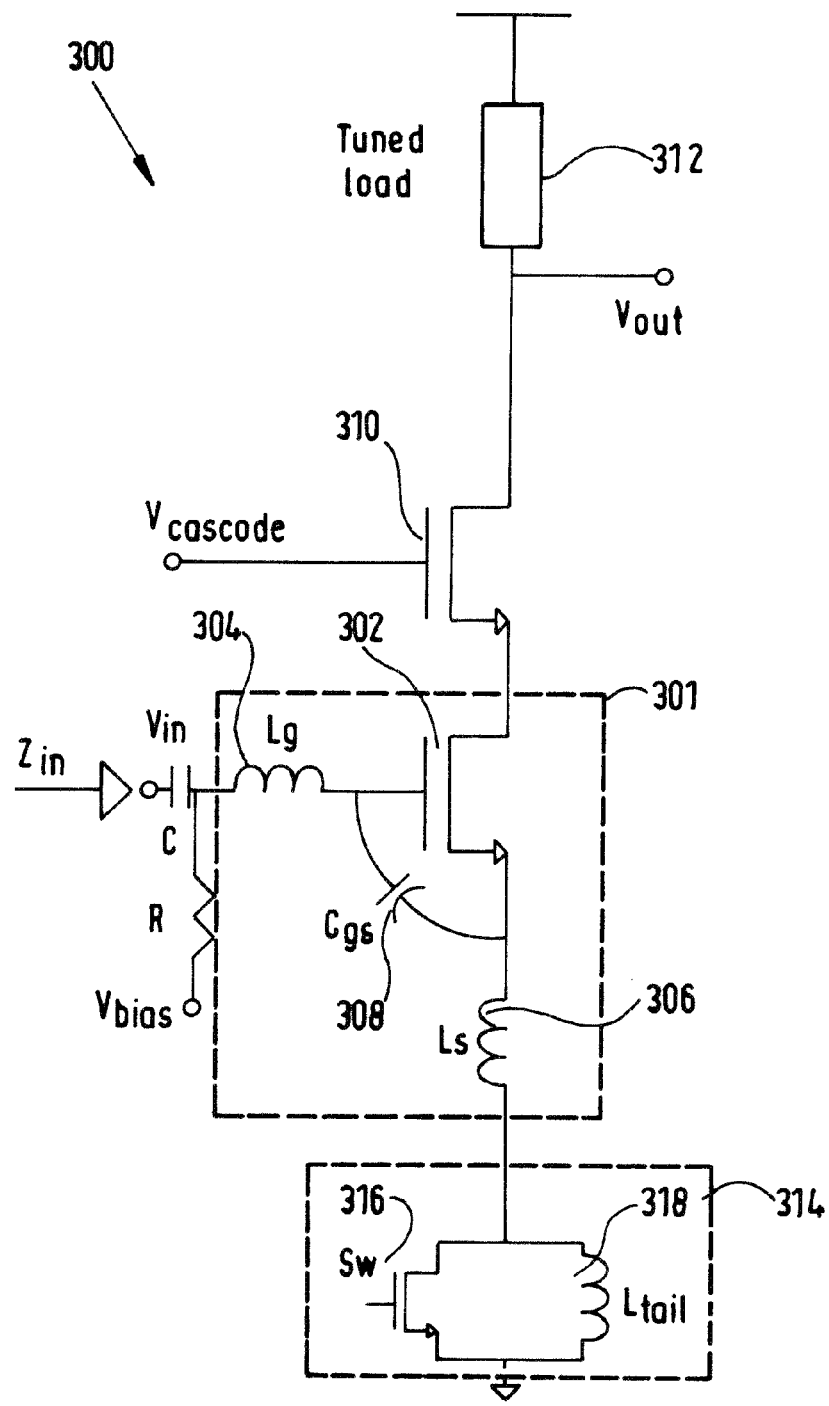
FIG. 3 is a schematic diagram illustrating a second embodiment of an LNA.

FIG. 3 is a schematic diagram illustrating a second embodiment of an LNA 300 in a cascode configuration. The LNA 300 includes an input circuit 301 with an amplifying device exemplarily implemented as comprising a transistor 302, a gate inductor 304, and a source inductor 306. A gate inductor 304 is electrically connected to the gate of the transistor 302. Moreover, a source inductor 306 is electrically connected to the source of the transistor 302, and a gate-source parasitic capacitor 308 of the transistor 302 is electrically connected to both the gate inductor 304 and the source inductor 306.

The LNA 300 further comprises a second stage, exemplarily implemented as a transistor 310. The source of the transistor 310 is electrically connected to the drain of the transistor 302. The drain of the transistor 310 is electrically connected to both a tuned load 312 and output terminal $V_{out}$. The gate of the transistor 310 is configured to receive a cascode voltage $V_{cascode}$.

The source inductor 306 is electrically connected to an impedance boosting circuit 314. The impedance boosting circuit 314 includes a switch 316 arranged between source inductor 306 and signal ground and a tail inductor 318 electrically connected in parallel with the switch 316. The switch 316 is implemented as a transistor.

When the LNA 300 operates with a large bias voltage $V_{bias}$, the LNA 300 is able to amplify a signal without adding much noise and has a good impedance match with a circuit providing the input signal $V_{in}$. In this case, the switch 316 of the impedance boosting circuit 314 is switched on, rendering the impedance boosting circuit 314 inactive.

Figure 4A:
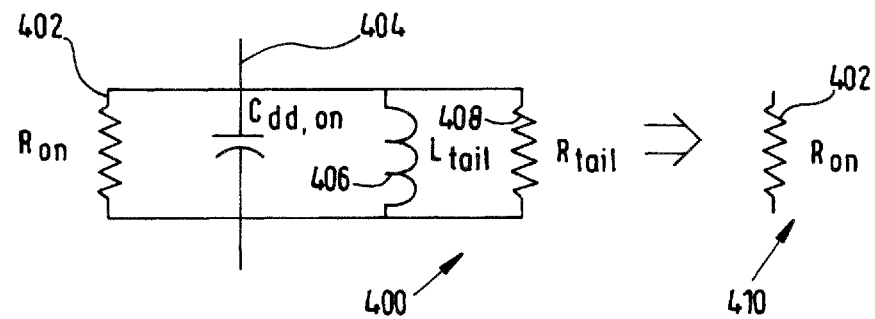
FIG. 4A shows the equivalent circuit and a simplified circuit of the impedance boosting circuit when the impedance boosting circuit is inactive.

FIG. 4A shows the equivalent circuit 400 and a simplified circuit 410 when the switch 316 is turned on and the impedance boosting circuit is inactive. The equivalent circuit 400 includes a switch resistance 402 ("$R_{on}$"), a total drain capacitance 404, a tail inductance 406, and a tail resistance 408. When the switch 316 is turned on, the impedance boosting circuit 314 may be simplified as comprising only the switch resistance 402. The switch resistance 402 is calculated by finding the inverse of the drain—source output conductance (Gds) of the switch 316.

In some embodiments, the channel (gate) width of switch transistor 316 is selected to be as wide as possible (refered to as wide transistor) in order to minimize the noise generated by the switch resistance 402. A wide transistor will however increase the total drain capacitance in the off state (capacitance 424 in FIG. 4B), which would degrade input impedance matching or even cause instability when the impedance boosting circuit 314 is activated (i.e., when the switch is turned off). To minimize additional noise, the following condition should be met: Switch resistance 402 $R_{on} \ll R_{in}$, where $R_{in}$ is the real part of the input impedance 4, of the LNA 300.

To give merely one example meeting the above condition, an LNA without an impedance boosting circuit has an $R_{in}$ of 50Ω and a noise figure of 1.49 dB. If an impedance boosting circuit is added having a switch resistance of 0.6Ω, the new noise figure is only slightly raised to 1.54 dB when the switch is on. The above parameters can be achieved, for example, by a transistor with a 900 μm gate width and a 90 nm length according to simulations in a 65 nm semiconductor process.

Figure 4B:
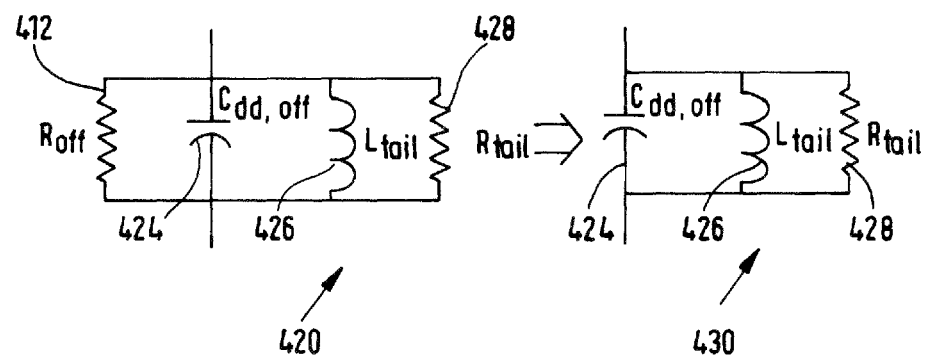
FIG. 4B shows the equivalent circuit and a simplified circuit of the impedance boosting circuit when the impedance boosting circuit is active.

FIG. 4B shows the equivalent circuit 420 and a simplified circuit 430 when the switch 316 is turned off and the impedance boosting circuit 314 is activated. The equivalent circuit 420 includes a switch resistance 412, a total drain capacitance 424, a tail inductance 426, and a tail resistance 428. When the switch 316 is turned off, the impedance boosting circuit 314 may be simplified to the switch capacitance 424, the tail inductance 426, and the tail resistance 428.

The total drain capacitance 424 should be small enough so to not overly disturb impedance matching or make the LNA 300 unstable. The following condition should be fulfilled for the LNA 300 to work optimally in this mode:

$$\frac{1}{\omega_{0,input} \cdot C_{dd,off}} \gg \omega_{0,input} \cdot L_{tail}$$

Fulfilling this condition ensures that the impedance of the impedance boosting circuit 314 is mostly inductive in nature at the operating frequency f0, where $\omega_0 = 2\pi f_0$. Another way to see this is that it is desirable that the tail inductor 318 does not resonate close to a normal operating frequency of the LNA 300. For example, for a tail inductance of 1 nH and a switch transistor with a gate width of 900 µm and a gate length of 90 nm resulting in a total drain capacitance of 300 fF, the self resonance frequency of an impedance boosting circuit can be calculated as:

$$f_{0,tail} = \frac{1}{2\pi\sqrt{C_{dd,off} \cdot L_{tail}}} = 9.1 \text{ GHz}$$

This frequency, in relation to an input signal frequency of 2.65 GHz, is high enough to not affect the functionality of an LNA.

The tail inductance 426 is added to the inductance of the drain inductor 306, and thus boosting the real part of the input impedance. This can compensate for the reduction in forward trans-conductance ($g_m$) of amplifying circuit 310 when operating with low bias currents. The input impedance can be calculated by the following formula:

$$z_{in} \cong \frac{g_m \cdot (L_s + L_{tail})}{C_{gs}} + j\left[\omega(L_s + L_{tail} + L_g) - \frac{1}{\omega C_{gs}}\right]$$

Figure 5:
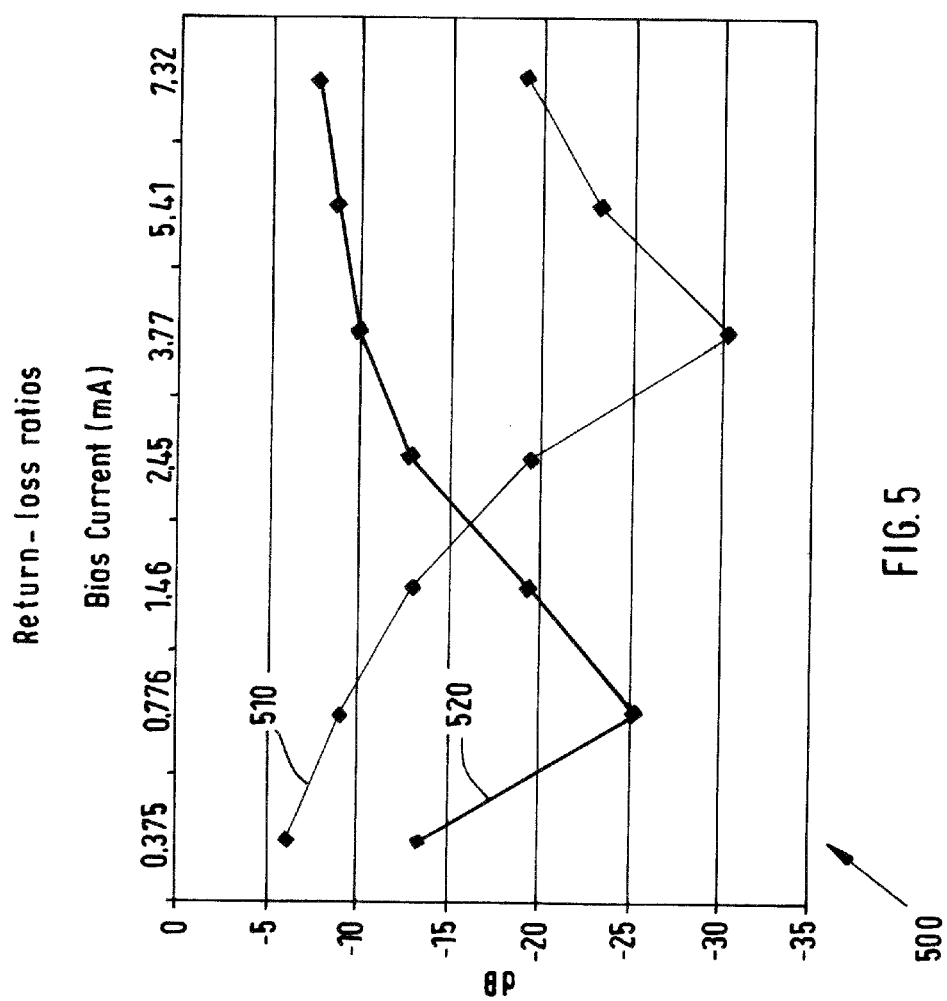
FIG. 5 is a chart illustrating a simulated return loss of the LNA of FIG. 3.

FIG. 5 is a chart 500 illustrating a simulated performance of the LNA 300 of FIG. 3 in a 65 nm process. The chart 500 contains the result from two simulations calculating the return-loss ratio of the LNA 300 for different bias current values. Line 510 shows the return-loss ratio when the LNA 300 is in a "high-performance mode" (i.e., with a high bias current) and the impedance boosting circuit 314 is inactive. Line 520 shows the return-loss ratio when the LNA 300 is in a "low-performance mode" (i.e., with a lower bias current) and the impedance boosting circuit 314 is active.

When in the high-performance mode, the LNA 300 provides a good impedance match for high bias current levels. For low bias current levels, which can be used when the input signal is strong and excellent noise performance is not needed, the impedance match degrades.

Once the impedance boosting circuit 314 is activated, the impedance boosting circuit 314 provides a good impedance match with, for example, an RF filter for a low bias current. The LNA 300 can thus be used with both high and low bias current settings without sacrificing a good impedance match with the RF filter. Depending on the component parameters of the LNA and the desired performance criteria (i.e., maximum acceptable noise figure, average power consumption), a wide range of bias current levels may be selected for the high-performance mode and the low-performance mode.

Figure 6:
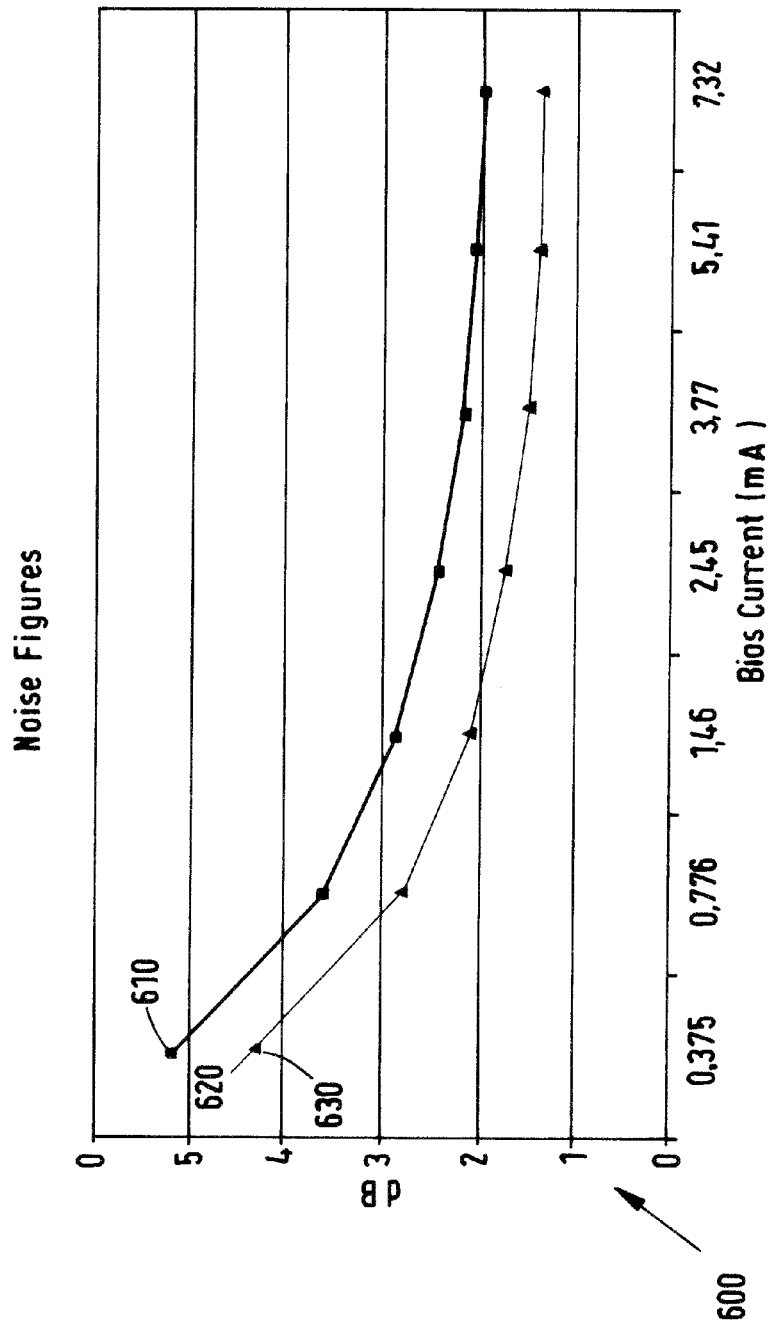
FIG. 6 is a chart illustrating the noise figures of the LNA of FIG. 3 in a high-performance mode and low-performance mode and an LNA without an impedance boosting circuit.

FIG. 6 is a chart 600 illustrating the noise figures of the LNA 300 of FIG. 3 in a high-performance mode and a low-performance mode and an LNA without an impedance boosting circuit. Line 610 shows the noise figures for the low-performance mode, line 620 shows the noise figures for the high-performance mode, and line 630 shows the noise figures for an LNA without an impedance boosting circuit. Lines 620 shows that the impedance boosting circuit 314 has only a slight impact on the noise figure of the LNA 300 when the impedance boosting circuit 314 is de-activated.

Figure 7:
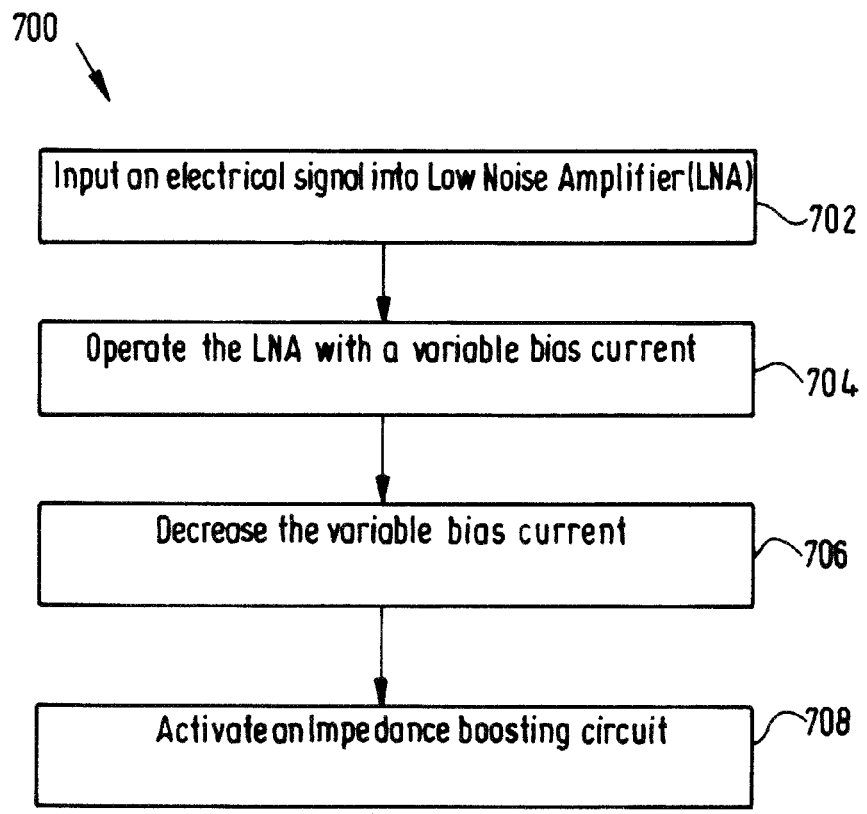
FIG. 7 is a flow chart illustrating an embodiment of a method of impedance matching the LNA in any of the embodiments presented herein with another electrical circuit.

FIG. 7 is a flow chart illustrating an embodiment of a method of impedance matching the LNA according to any of the embodiments presented herein with another electrical circuit. At step 702, an electrical signal is inputted into the LNA. At step 704, the LNA is operated with a variable bias current. At step 706, the bias current is decreased. At step 708, the impedance boosting circuit is activated. In some embodiments, the order of steps 706 and 708 may be reversed.

In some embodiments, the step of operating the LNA with the variable biasing current includes selectively operating the LNA in at least a high-performance mode or a low-performance mode, wherein a bias current for the high-performance mode is higher than a bias current for the low-performance mode. Further, the step of activating the impedance boosting circuit includes activating the impedance boosting circuit if operating in the low-performance mode. Further still, the step of deactivating the impedance boosting circuit includes deactivating the impedance boosting circuit if operating in the high-performance mode.

Figure 8:
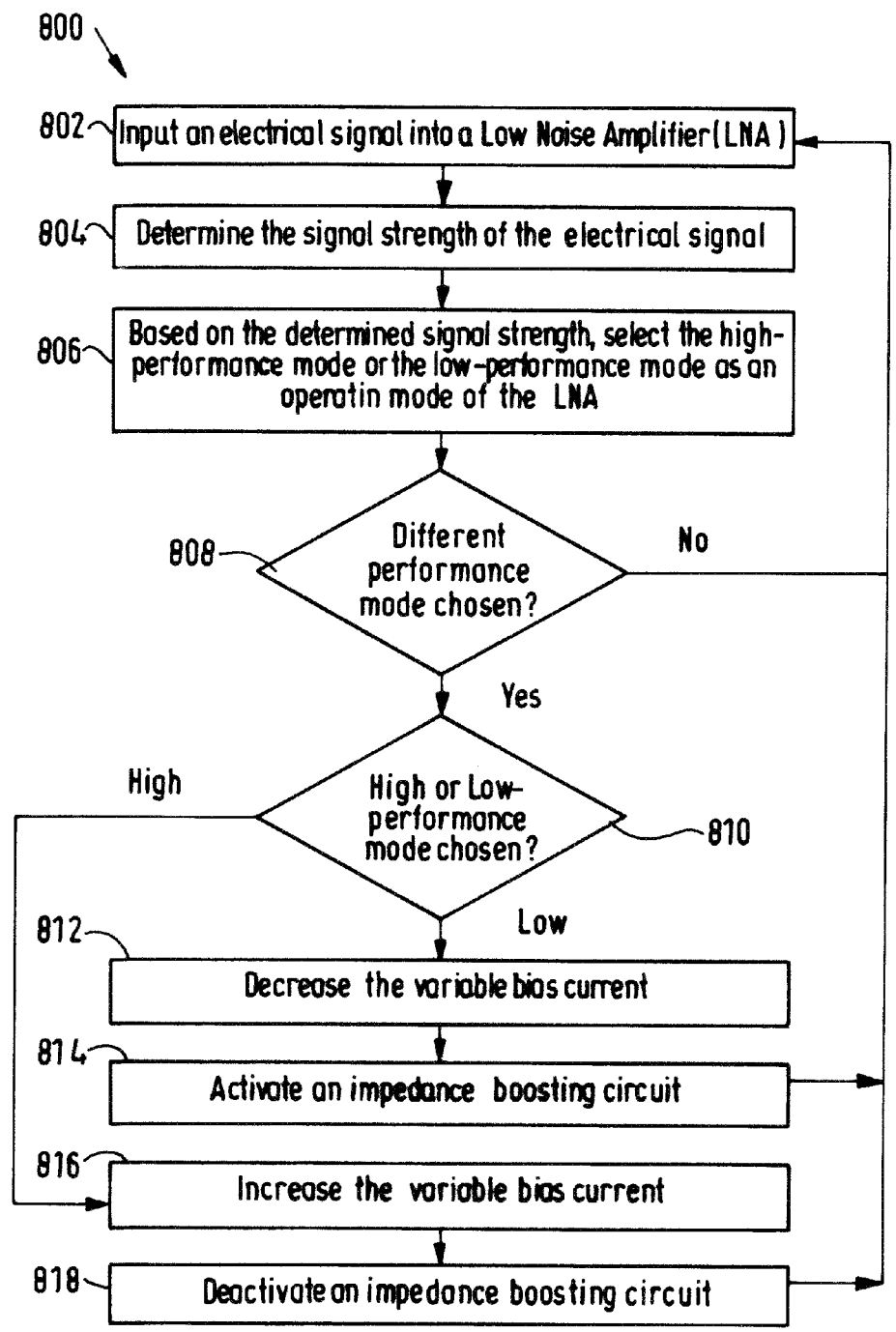
FIG. 8 is a flow chart illustrating a second embodiment of a method of impedance matching the LNA of any of the embodiments presented herein with another electrical circuit.

FIG. 8 is a flow chart illustrating a second embodiment of a method 800 of impedance matching the LNA according to any of the embodiments presented herein with another electrical circuit. At step 802, an electrical signal is inputted into the LNA. At step 804, the signal strength of the electrical signal is determined or the information is obtained from a base station of the communications network. At step 806, a high-performance mode or a low-performance mode is selected based on the determined signal strength. In some embodiments, if a signal strength is above a certain threshold, the low-performance mode is selected. At step 808, a check is made as to whether the chosen performance mode is the same or different from the current performance mode. If the current mode is selected, the method returns to step 802.

If a different mode is selected, the method 800 continues to step 810, where a check is made as to whether the low or high-performance mode was selected. If the low-performance mode was selected, the variable bias current is decreased at step 812 and the impedance boosting circuit is activated at step 814. In some embodiments, the order of steps 812 and 814 may be switched. After step 814, the method 800 returns to step 802. If the high-performance mode was selected, the variable bias current is increased at step 816 and the impedance boosting circuit is deactivated at step 818. In some embodiments, the order of steps 816 and 818 may be reversed. After step 818, the method 800 returns to step 802.

Figure 9A:
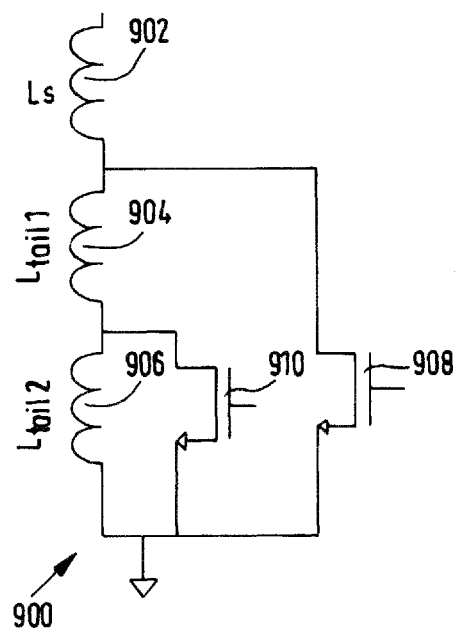
FIGS. 9A to 9C are schematic diagrams illustrating alternative embodiments of an impedance boosting circuit.
Figure 9B:
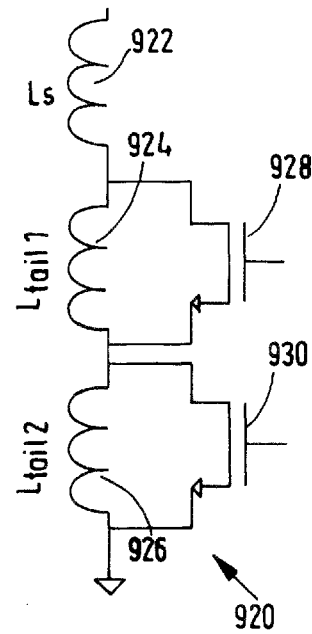
Figure 9C:
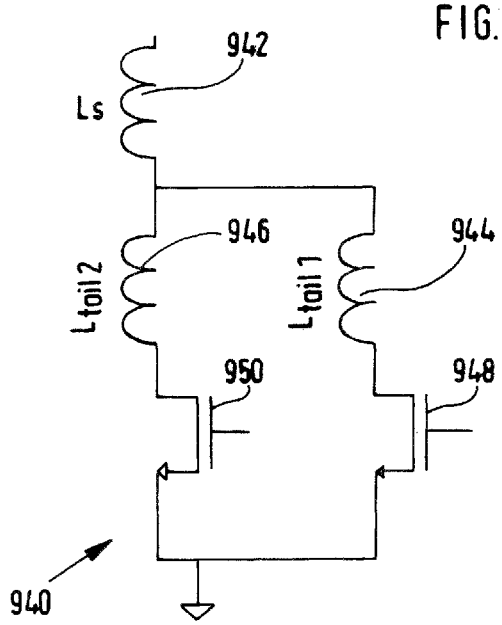

FIGS. 9A, 9B, and 9C are schematic block diagrams illustrating alternative embodiments of an impedance boosting circuit.

In FIG. 9A, an impedance boosting circuit 900 is connected to a source inductor 902. The impedance boosting circuit 900 includes a first tail inductor 904, a second tail inductor 906, a first switch 908, and a second switch 910. The first tail inductor 904 is electrically connected to both the first switch 908 and the second switch 910. The second tail inductor 906 is electrically connected in parallel with the second switch 910.

Thus, the impedance boosting circuit 900 of FIG. 9A is capable of having more than two performance modes, wherein the total inductance may include the source inductor 902, the first tail inductor 904, and the second tail inductor 906; or the source inductor 902 and the first tail inductor 904; or only the source inductor 902.

In FIG. 9B, an impedance boosting circuit 920 is connected to a source inductor 922. The impedance boosting circuit 920 includes a first tail inductor 924, a second tail inductor 926, a first switch 928, and a second switch 930. The first tail inductor 924 is electrically connected in parallel with the first switch 928. The second tail inductor 926 is electrically connected in parallel with the second switch 930.

Thus, the impedance boosting circuit 920 of FIG. 9B is capable of having more than two performance modes, wherein the total inductance may include the source inductor 922, the first tail inductor 924, and the second tail inductor 926; or the source inductor 922 and the first tail inductor 924; or the source inductor 922 and the second tail conductor 926; or only the source inductor 922.

In FIG. 9C, an impedance boosting circuit 940 is connected to a source inductor 942. The impedance boosting circuit 940 includes a first tail inductor 944, a second tail inductor 946, a first switch 948, and a second switch 950. The first tail inductor 944 is electrically connected to the source inductor 942, the second tail inductor 946, and the first switch 948. The second tail inductor 946 is electrically connected to the source inductor 942, the first tail inductor 944, and the second switch 950.

Thus, the impedance boosting circuit 940 of FIG. 9C is capable of having more than two performance modes, wherein the total inductance may include the source inductor 942 and the first tail inductor 944; or the source inductor 942 and the second tail conductor 946; or the source inductor and the parallel connection of the first and second tail inductors.

When the impedance boosting circuit 900, 920 or 940 is implemented in the LNA, a multi-bit control signal can control the switches in accordance with different performance modes and thereby vary the input impedance of the LNA.

Figure 10:
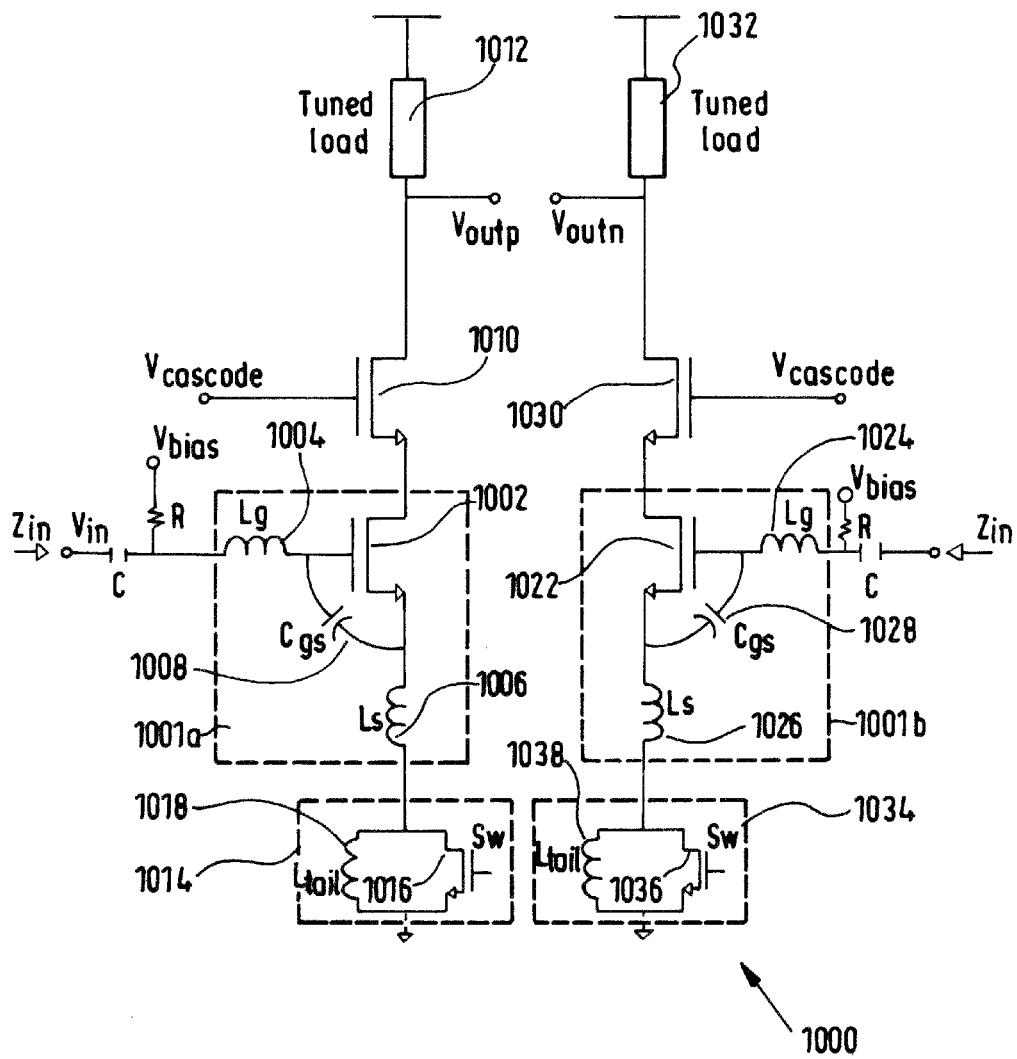
FIG. 10 is a schematic diagram illustrating a third embodiment of an LNA.

FIG. 10 is a schematic diagram illustrating a third embodiment of an LNA 1000. The LNA 1000 is a differential (i.e., balanced) LNA with two impedance boosting circuits controlled by a single control signal. The control signal controls both switch 1016 and switch 1036.

The LNA 1000 includes a first input circuit 1001a implemented as using a transistor 1002. A gate inductor 1004 is electrically connected to the gate of the transistor 1002. A source inductor 1006 is electrically connected to the source of the transistor 1002. A parasitic gate source capacitor 1008 is electrically connected to both the gate inductor 1004 and the source inductor 1006.

The input of a second stage circuit 1010 of the LNA 1000 is electrically connected to the drain of transistor 1002. The output of the second stage circuit 1010 is electrically connected to a tuned load 1012 and outputs of the LNA $V_{out}$.

The source inductor 1006 is electrically connected to an impedance boosting circuit 1014. The impedance boosting circuit 1014 includes a switch 1016 arranged between the source inductor 1006 and signal ground. A tail inductor 1018 is electrically connected in parallel with the switch 1016. The switch 1016 is implemented as a transistor.

The LNA 1000 also includes a second input circuit 1001b (having similar structure as the input circuit 1001a), a second stage circuit 1030, an impedance boosting circuit 1034 and a tuned load 1032, all connected in the similar way as described above.

Figure 11:
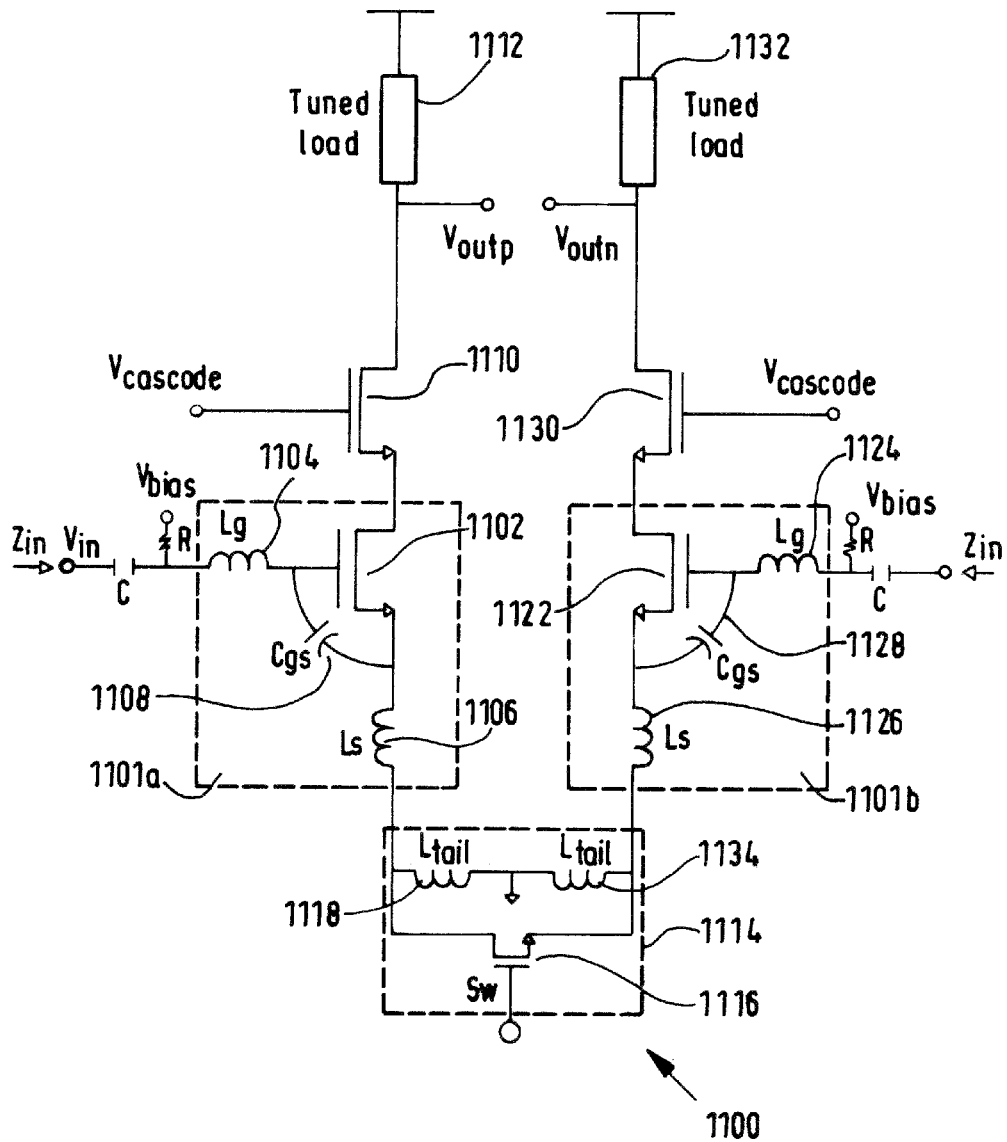
FIG. 11 is a schematic diagram illustrating a fourth embodiment of an LNA.

FIG. 11 is a schematic diagram illustrating a fourth embodiment of an LNA 1100. The LNA 1100 is again a differential (i.e., balanced) LNA similar to FIG. 10 but with one impedance boosting circuit 1114 controlled by a single bit control signal.

The impedance boosting circuit 1114 includes a switch 1116 electrically connected with tail inductors 1118 and 1134. First ends of the tail inductors 1118 and 1134 are connected to source inductors 1106 and 1126, respectively, and the other ends of the tail inductors 1118 and 1134 are connected together to signal ground. The tail inductors 1118 and 1134 may be implemented as a single differential inductor with a centre tap connected to signal ground.

Figure 12:
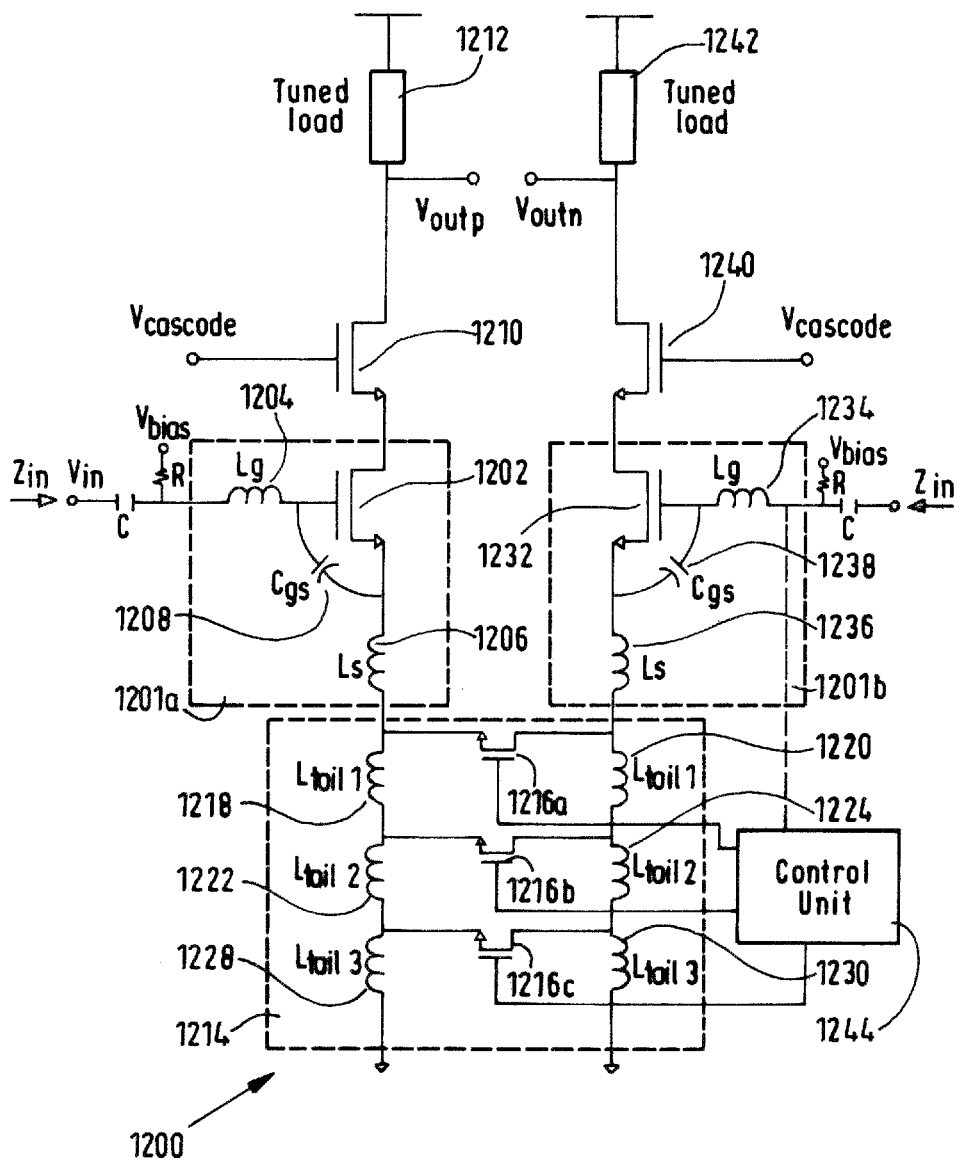
FIG. 12 is a schematic diagram illustrating a fifth embodiment of an LNA.

FIG. 12 shows a schematic block diagram illustrating a fifth embodiment of an LNA 1200. The LNA 1200 is also a differential (i.e., balanced) LNA but with an impedance boosting circuit 1214 having multiple performance modes (e.g., controlled by a multiple-bit control signal).

The impedance boosting circuit 1214 comprises two branches of tail inductors. One branch includes three tail inductors 1218, 1222 and 1228 connected in series and connected to source inductor 1206 and the other branch also includes three tail inductors 1220, 1224 and 1230 connected in series and connected to source inductor 1236. The impedance boosting circuit 1214 further includes a first switch 1216a electrically connected to first ends of the tail inductors 1218 and 1220, a second switch 1216b electrically connected to second ends of the tail inductors 1218 and 1220 and first ends of the tail inductors 1222 and 1224 and a third switch 1216c electrically connected to second ends of the tail inductors 1222 and 1224 and first ends of the tail inductors 1228 and 1230. The second ends of the tail inductors 1228 and 1230 are connected to signal ground. The first, second and third switch 1216a, 1216b and 1216c are implemented as a transistor.

The tail inductors 1228 and 1230 may be implemented as a single or one combined differential inductor with a center tap connected to signal ground as shown for the impedance boosting circuit 1114 of FIG. 11.

The LNA 1200 further includes a control unit 1244, which may be coupled to the gates of the first switch 1216a, the second switch 1216b, and the third switch 1216c. In alternative embodiments, the first switch 1216a, the second switch 1216b, and the third switch 1216c may be controlled directly by the bias current. The control unit 1244 may monitor the bias level and switch the first switch 1216a, the second switch 1216b, and/or the third switch 1216c based on the bias level. In some embodiments, the control unit 1244 may switch the first switch 1216a, the second switch 1216b, and/or the third switch 1216c based on a combination of the bias level and the measured input impedance.

In some embodiments, the control unit 1244 may provide switch signals based on a determined performance mode and not monitor the bias level. The control unit 1244 may provide a one-bit or multi-bit control signal. For example, the control unit may be configured to activate two or more switches via a multi-bit control signal. In other embodiments, a low-noise amplifier may include more than one control unit each providing a one-bit control signal. The control unit variations described above may be implemented in any of the embodiments presented.

Although the transistors in the above embodiments are illustrated as N-type MOS (Metal Oxide Semiconductor) transistors, they could be implemented as P-type MOS or any other type of transistor as well. For the switches in the impedance boosting circuit MEMS technology could be used.

Figure 13:
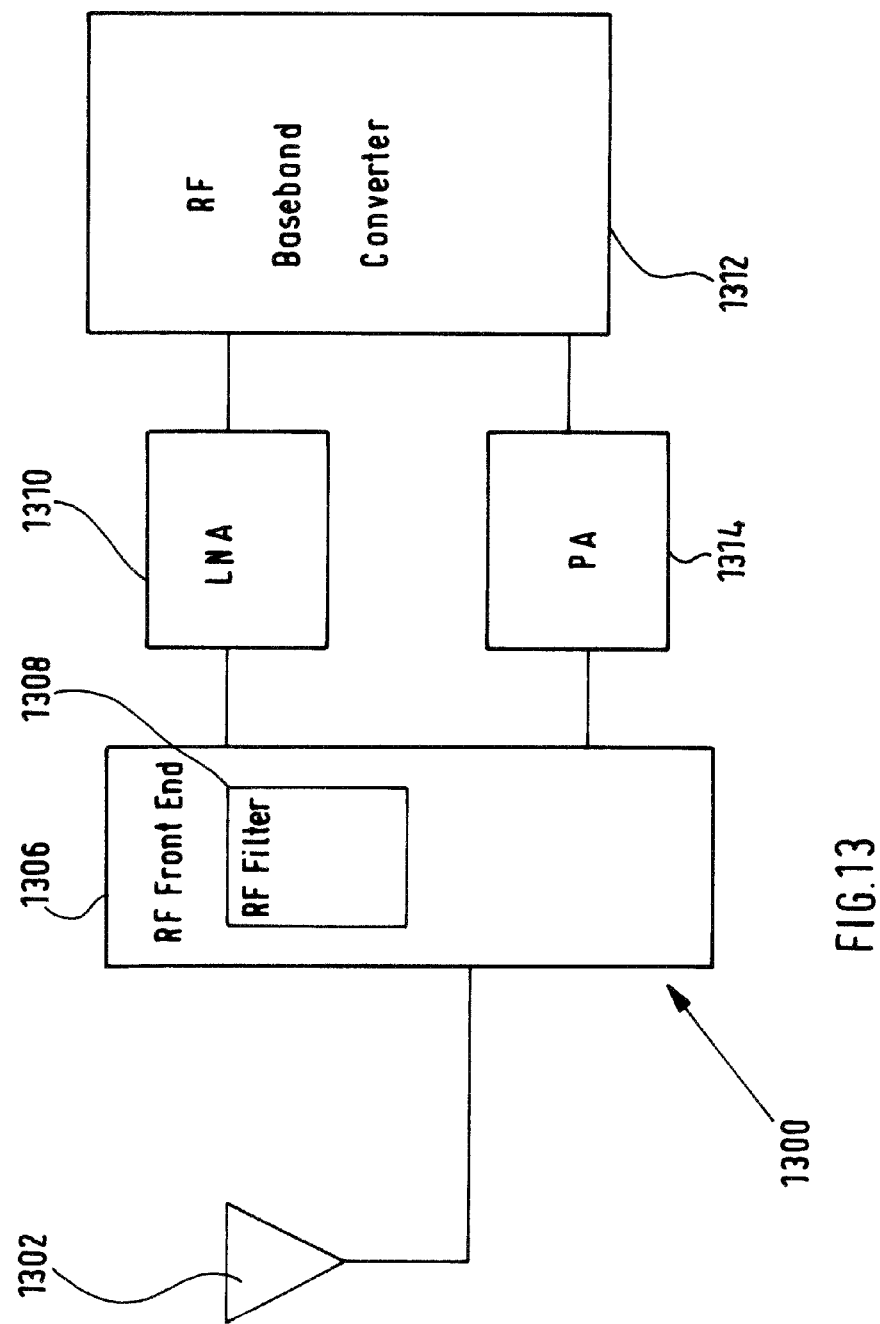
FIG. 13 is a simplified diagram of a mobile radio receiver.

FIG. 13 is a simplified block diagram of a mobile radio receiver 1300. The receiver 1300 may be compliant with the LTE specifications and implemented in a mobile terminal, such as a mobile telephone, network card or data stick, portable computer, and so on.

An antenna 1302 of the receiver 1300 receives and transmits data in a radio frequency band. An RF front end stage 1306 is connected to at least one antenna 1302. When receiving, an RF signal is fed to the RF front end stage 1306 and filtered by an RF filter 1308. The filtered signal is then fed into LNA 1310, where the signal may be processed as described in the embodiments above. The LNA 1310 may output to a radio frequency-to-baseband converter 1312.

When transmitting, the converter 1312 may also convert a baseband signal for transmission into a radio frequency (RF) and feed the RF signal to a power amplifier 1314. The power amplifier 1314 feeds the amplified RF signal to the RF front end stage 1306 with filters, from where it can be transmitted by antenna 1302.

As has become apparent from the above embodiments, the technique presented herein provides several advantages. When the impedance boosting circuit is not needed during a high-performance mode, the impedance boosting circuit has a minimum affect on the noise figure of the LNA. The impedance boosting circuit also enables an LNA to save power by biasing at low current levels when an input signal level is sufficiently strong.

The impedance boosting circuit has the further advantage of minimally affecting linearity of an LNA because the signal swing across the impedance boosting circuit is small. Further, the impedance boosting circuit may be configured to employ inductors with low Q values. Such embodiments have a small footprint and minimally affect the resonance of the LNA input loop.

In general, a circuit topology for reducing the bias current of an LNA without degrading the impedance match with an RF filter is based on the finding that the radio environment in real-life use is rarely as demanding as the toughest specification requirements. This suggests that an LNA should only consume full power when conditions of the radio environment require it, but it should be otherwise in a "low-power consumption mode".

Although embodiments of the proposed technique have been illustrated in the accompanying drawings and described in the description, it will be understood that the invention is not limited to the embodiments disclosed herein. In particular, the proposed technique is capable of numerous rearrangements, modifications and substitutions without departing from the scope of the invention as set forth and defined by the following claims.

The invention claimed is:

1. A low-noise amplifier having an input terminal and an output terminal, the low-noise amplifier comprising:
   an input circuit configured to operate with a variable bias current, the input circuit comprising:
      a transistor having a gate electrically connected to a gate inductor and a source electrically connected to a source inductor, wherein the gate inductor is electrically connected to the input terminal; and
   an impedance boosting circuit electrically connected to the source inductor, the impedance boosting circuit comprising:
      at least two switches comprising at least two switch transistors controlled by a control signal that varies the total inductance of the impedance boosting circuit and thereby varies the input impedance of the low-noise amplifier; and
      at least two tail inductors electrically connected with the at least two switches, the at least two tail inductors for increasing the input impedance of the low-noise amplifier when the impedance boosting circuit is activated via the at least two switches; and
   wherein the low-noise amplifier is configured to activate the impedance boosting circuit if the variable bias current is reduced.

2. The low-noise amplifier of claim 1, wherein each tail inductor of the at least two tail inductors is connected in parallel with a corresponding switch of the at least two switches.

3. The low-noise amplifier of claim 2, wherein the control signal activates and de-activates the impedance boosting circuit and thereby varies the input impedance of the low-noise amplifier.

4. The low-noise amplifier of claim 1, wherein the low-noise amplifier is configured as a single-ended amplifier and the transistor includes a drain electrically connected to the output terminal of the low-noise amplifier if the low noise amplifier is a single-stage amplifier or to a second stage if the amplifier is a multi-stage amplifier.

5. The low-noise amplifier of claim 1, wherein the low-noise amplifier is configured as a differential amplifier comprising:
   two input circuits, the two input circuits each comprising a transistor, a gate inductor, and a source inductor; and
   two impedance boosting circuits, wherein the source inductors of the two input circuits are electrically connected to one of the two impedance boosting circuits, respectively.

6. The low-noise amplifier of claim 1, wherein the low-noise amplifier is configured as a differential amplifier comprising:
   two input circuits, the two input circuits each comprising a transistor, a gate inductor, and a source inductor; and
   wherein the impedance boosting circuit is electrically connected to each of the source inductors of the two input circuits.

7. A low-noise amplifier configured as a differential amplifier comprising:
   two input circuits, the two input circuits each comprising a transistor having a gate electrically connected to a gate inductor and a source electrically connected to a source inductor, wherein the gate inductor is electrically connected to an input terminal, wherein each input circuit is configured to operate with a variable bias current; and
   an impedance boosting circuit electrically connected to the source inductors, the impedance boosting circuit comprising:
      two branches of tail inductors, each branch comprising at least two tail inductors electrically connected in series; and
      at least two switch transistors electrically connected to both the two branches of tail inductors and configured to be controlled by a control signal that thereby varies the input impedance of the low-noise amplifier,
   wherein the low-noise amplifier is configured to activate the impedance boosting circuit if the variable bias current is reduced.

8. The low-noise amplifier of claim 7, wherein each branch of the tail inductors further comprises a third tail inductor electrically connected to a third switch transistor.

9. The low-noise amplifier of claim 8, wherein the two third tail inductors are configured as a differential inductor.

10. The low-noise amplifier of claim 1, wherein the low-noise amplifier is further configured to deactivate the impedance boosting circuit if the variable bias current is increased.

11. The low-noise amplifier of claim 1, wherein the low-noise amplifier is further configured to reduce the variable bias current if an input signal amplitude is above a predetermined value.

12. The low-noise amplifier of claim 1, wherein the inductance of the at least two tail inductors is selected such that the input impedance of the low-noise amplifier matches the output impedance of a circuit electrically connected to an input terminal of the low-noise amplifier when the impedance boosting circuit is activated.

13. The low-noise amplifier of claim 1, wherein:
the low-noise amplifier is configured to selectively operate in at least a high-performance mode and a low-performance mode;
a bias current for the high-performance mode is higher than a bias current for the low-performance mode; and
the low-noise amplifier is configured to activate the impedance boosting circuit if operating in the low-performance mode and deactivate the impedance boosting circuit if operating in the high-performance mode.

14. The low-noise amplifier of claim 1, wherein the low-noise amplifier further comprises a control unit configured to provide a one-bit or a multi-bit control signal, to control the impedance boosting circuit.

15. A circuit arrangement, comprising:
a low-noise amplifier having an input terminal and an output terminal and comprising:
an input circuit configured to operate with a variable bias current, the input circuit comprising:
a transistor having a gate electrically connected to a gate inductor and a source electrically connected to a source inductor, wherein the gate inductor is electrically connected to the input terminal; and
an impedance boosting circuit electrically connected to the source inductor, the impedance boosting circuit comprising:
at least one switch; and
at least one tail inductor electrically connected with the at least one switch, the at least one tail inductor for increasing the input impedance of the low-noise amplifier when the impedance boosting circuit is activated via the at least one switch; and
an RF front end stage configured to provide an input signal to the input terminal of the low-noise amplifier and comprising a radio frequency front end comprising a radio frequency filter, the radio frequency filter having an output impedance; and
wherein the low-noise amplifier is configured to activate the impedance boosting circuit if the variable bias current is reduced, and the at least one tail inductor is configured to increase the input impedance of the low-noise amplifier when the impedance boosting circuit is activated such that the input impedance of the low-noise amplifier matches the output impedance of the radio frequency filter.

16. A method of impedance matching a low-noise amplifier with another electrical circuit, wherein the low-noise amplifier comprises an input circuit and an impedance boosting circuit and the method comprises:
inputting an electrical signal into the input circuit, the input circuit configured to operate with a variable bias current and comprising a transistor having a gate electrically connected to a gate inductor and a source electrically connected to a source inductor, wherein the electrical signal inputs to the gate inductor;
operating the input circuit with the variable bias current by selectively operating the low-noise amplifier in at least a high-performance mode and a low-performance mode, wherein a bias current for the high-performance mode is higher than a bias current for the low-performance mode;
reducing the variable bias current; and
activating the impedance boosting circuit if operating in the low-performance mode and de-activating the impedance boosting circuit if operating in the high performance mode, wherein the impedance boosting circuit is electrically connected to the source inductor and comprises:
at least one switch; and
at least one tail inductor electrically connected with the at least one switch, the at least one tail inductor configured to increase the input impedance of the low-noise amplifier when the impedance boosting circuit is activated via the at least one switch.

17. The method of claim 16, further comprising:
determining the signal strength of the electrical signal; and
based on the determined signal strength, selecting the high-performance mode or the low-performance mode as the operating mode of the low-noise amplifier.

18. The method of claim 17, further comprising:
determining if the selected operating mode is the current operating mode;
if the selected operating mode is different from the current operating mode, changing the operating mode to the selected operating mode.

19. A mobile terminal comprising the low-noise amplifier of claim 1.

20. A mobile terminal comprising the low-noise amplifier of claim 7.

21. A mobile terminal, comprising the circuit arrangement of claim 15.

22. A mobile terminal comprising a low-noise amplifier configured to match impedance with another electrical circuit, the low-noise amplifier comprising:
an input circuit configured to operate with a variable bias current and comprising a transistor having a gate electrically connected to a gate inductor and a source electrically connected to a source inductor, wherein an electrical signal inputs to the gate inductor;
an impedance boosting circuit electrically connected to the source inductor and comprising:
at least one switch; and
at least one tail inductor electrically connected with the at least one switch, the at least one tail inductor configured to increase the input impedance of the low-noise amplifier when the impedance boosting circuit is activated via the at least one switch; and
a control circuit configured to:
input the electrical signal to the input circuit;
operate the input circuit with the variable bias current by selectively operating the low-noise amplifier in at least a high-performance mode and a low-performance mode, wherein a bias current for the high-performance mode is higher than a bias current for the low-performance mode;
reduce the variable bias current; and activate the impedance boosting circuit if operating in the low-performance mode and de-activate the impedance boosting circuit if operating in the high performance mode.

23. The mobile terminal of claim 22, wherein the control circuit is configured to:
   determine the signal strength of the electrical signal; and
   based on the determined signal strength, select the high-performance mode or the low-performance mode as the operating mode of the low-noise amplifier.

24. The mobile terminal of claim 23, wherein the control circuit is configured to:
   determine if the selected operating mode is the current operating mode; and
   if the selected operating mode is different from the current operating mode, change the operating mode to the selected operating mode.

* * * * *

UNITED STATES PATENT AND TRADEMARK OFFICE
CERTIFICATE OF CORRECTION

PATENT NO.      : 9,077,290 B2                              Page 1 of 1
APPLICATION NO. : 13/988595
DATED           : July 7, 2015
INVENTOR(S)     : Din et al.

It is certified that error appears in the above-identified patent and that said Letters Patent is hereby corrected as shown below:

In the Specification

In Column 1, Line 50, delete "$M_t$." and insert -- $M_1$. --, therefor.

Signed and Sealed this
Eighth Day of March, 2016

Michelle K. Lee
*Director of the United States Patent and Trademark Office*